(12) United States Patent
Tsai et al.

(10) Patent No.: US 12,279,400 B2
(45) Date of Patent: Apr. 15, 2025

(54) LIQUID COOLED SERVER CHASSIS

(71) Applicant: Cooler Master Co., Ltd., Taipei (TW)

(72) Inventors: Shui-Fa Tsai, Taipei (TW); Tsung-Wei Lin, Taipei (TW)

(73) Assignee: Cooler Master Co., Ltd., Taipei (TW)

( * ) Notice: Subject to any disclaimer, the term of this patent is extended or adjusted under 35 U.S.C. 154(b) by 257 days.

(21) Appl. No.: 17/747,993

(22) Filed: May 18, 2022

(65) Prior Publication Data

US 2023/0018736 A1    Jan. 19, 2023

(51) Int. Cl.
*H05K 7/20* (2006.01)

(52) U.S. Cl.
CPC ..... *H05K 7/20772* (2013.01); *H05K 7/20254* (2013.01); *H05K 7/20272* (2013.01)

(58) Field of Classification Search
CPC ........... H05K 7/20254; H05K 7/20727; H05K 7/20772; H05K 7/20272; G06F 1/20
See application file for complete search history.

(56) References Cited

U.S. PATENT DOCUMENTS

| | | | | |
|---|---|---|---|---|
| 8,724,315 B2* | 5/2014 | Branton | ............. | H05K 7/20263 |
| | | | | 361/689 |
| 9,788,451 B2* | 10/2017 | Bailey | ................. | H05K 7/1485 |
| 10,191,521 B2* | 1/2019 | Cheng | ................ | H05K 7/20318 |
| 11,337,340 B2* | 5/2022 | Harrington | ........ | H05K 7/20781 |
| 2018/0066663 A1* | 3/2018 | Kulkarni | ........... | H05K 7/20172 |

FOREIGN PATENT DOCUMENTS

| | | |
|---|---|---|
| CN | 108279759 A | 7/2018 |
| TW | M295764 U | 8/2006 |

\* cited by examiner

*Primary Examiner* — Zachary Pape

(57) ABSTRACT

A liquid cooled server chassis comprising a chassis, at least one electronics module having at least one heat generating component mounted thereon, and a liquid cooling unit, having at least one liquid plate heat exchanger, a liquid row heat sink, an inlet chassis manifold, and an outlet chassis manifold, is provided. The at least one liquid plate heat exchanger, mounted and thermally coupled to the at least one heat generating component, is in fluid communication with the inlet chassis manifold and outlet chassis manifold, transporting heat away from the at least one heat generating component. The liquid row heat sink, in fluid communication with the inlet chassis manifold and outlet chassis manifold, is configured to lower a flowthrough temperature of ambient airflow flowing through the liquid row heat sink. The at least one electronics module and liquid row heat sink are parallel arranged, whereby cooling power is evenly distributed thereamong.

20 Claims, 6 Drawing Sheets

LIQUID COOLED SERVER CHASSIS

RELATED APPLICATIONS

This US application claims the benefit of priority to Taiwan application no. 110124905, filed on Jul. 7, 2021, of which is incorporated herein by reference in its entirety.

TECHNICAL FIELD

Example embodiments relate generally to the field of heat dissipation using fluid and, more particularly, to liquid cooled server chassis' using a circulating cooling fluid that dissipates heat generated by a server.

BACKGROUND

With the increase of the processing speed and performance of electronic components, such as central processing units (CPUs), the amount of heat generated during operation of the electronic component increases. The heat generation increases the temperature of the electronic component and, if the heat cannot be dissipated effectively, reliability and performance of the electronic component are reduced. To prevent overheating of an electronic component, typically, a liquid cooling unit is used for cooling the electronic component and, thereby maintaining normal operation of the electronic component.

Existing liquid cooling units typically include a heat sink mounted to an electronic component, such as a central processing unit (CPU), a graphics processing unit (GPU) or a memory card, as examples. The heat sink is fluidly connected to a fluid circulating pump. The pump circulates cooling fluid inside the heat sink in order to deliver the cooling fluid at lower temperature to the heat sink. As the fluid circulates in the heat sink, thermal energy is exchanged between the heat sink and the fluid and, as a result, the temperature of a base plate of the heat sink is reduced and the temperature of the cooling fluid increases. The higher temperature cooling fluid is then cooled and circulated back to the heat sink. However, the liquid cooling units are often of complicated structures and this causes a reduction in heat transfer efficiency.

The liquid cooling unit structures become more complex when cooling more than one electronic component, such as those in high-density equipment rack-mounted assemblies. In the assemblies, heat transfer efficiency is further exacerbated, and the liquid cooling unit structures become even more complex, when attempting to evenly distribute cooling power to more than one heat sink in the liquid cooling unit. Complexity of the liquid cooling unit structures is even further increased, when attempting to efficiently air cool other electronic components not mounted to the heat sinks.

Furthermore, existing liquid cooling units cannot be easily reassembled to efficiently dissipate heat from more than one electronic component at a time.

SUMMARY

Various aspects of the present disclosure provide a liquid cooled server chassis for dissipating heat generated by electronic components.

According to one aspect of the present disclosure, the liquid cooled server chassis comprises a chassis, at least one electronics module, and a liquid cooling unit. The chassis has a base plate, a first side plate, and a second side plate. The base plate has a front base plate end and a distal base plate end. The first side plate is connected to the second side plate via the base plate and the first side plate and the second side plate are between the front base plate end and the distal base plate end, respectively. The at least one electronics module has at least one heat generating component mounted thereon and is attached to the base plate between the distal base plate end and front base plate end. The liquid cooling unit is configured to be flow through by a cooling fluid and comprises at least one liquid plate heat exchanger, a liquid row heat sink, an inlet chassis manifold, and an outlet chassis manifold. The at least one liquid plate heat exchanger is mounted to the at least one heat generating component. The liquid row heat sink is attached to the base plate near to the distal base plate end between the distal base plate end and at least one electronics module. The inlet chassis manifold is fixed to the first side plate and the outlet chassis manifold is fixed to the second side plate. The at least one liquid plate heat exchanger is thermally coupled to the at least one heat generating component and the at least one liquid plate heat exchanger is in fluid communication with the inlet chassis manifold and outlet chassis manifold, respectively, whereby the at least one liquid plate heat exchanger transports heat away from the at least one heat generating component. The liquid row heat sink is in fluid communication with the inlet chassis manifold and outlet chassis manifold, respectfully, wherein the liquid row heat sink is configured to lower a flowthrough temperature of ambient airflow flowing through the liquid row heat sink.

According to another aspect of the present disclosure, a shape of the liquid cooled server chassis comprises a cuboid shape having a base and at least two opposing lateral sides, whereby the base comprises the base plate and the at least two opposing lateral sides comprise the first side plate and the second side plate, respectively.

According to another aspect of the present disclosure, the at least one heat generating component mounted to the at least one electronics module comprises a processor, and According to yet another aspect of the present disclosure the processor comprises a central processing unit (CPU).

According to another aspect of the present disclosure, the at least one liquid plate heat exchanger is a liquid cold plate, and According to another aspect of the present disclosure, the liquid row heat sink is a water-cooled heat sink row.

According to another aspect of the present disclosure, the inlet chassis manifold comprises an external inlet manifold lateral side and a first inlet manifold lateral side, opposite the external inlet manifold lateral side. According to yet another aspect of the present disclosure, the first inlet manifold lateral side is fixed to the first side plate. According to yet another aspect of the present disclosure, the inlet chassis manifold is integrally formed with the first side plate. According to another aspect of the present disclosure, the outlet chassis manifold comprises an external outlet manifold lateral side and a second outlet manifold lateral side, opposite the external outlet manifold lateral side. According to yet another aspect of the present disclosure, the second outlet manifold lateral side is fixed to the second side plate. According to yet another aspect of the present disclosure, the outlet chassis manifold is integrally formed with the second side plate. According to another aspect of the present disclosure, an exterior shape of the inlet chassis manifold and the outlet chassis manifold comprises a cuboid shape, respectively. In the illustrated embodiments, the external inlet manifold lateral side and external outlet manifold lateral side are configured for rail mounts to be fixed thereto, respectively.

According to another aspect of the present disclosure, the inlet chassis manifold comprises an inlet channel, an inlet channel opening, at least one inlet interior plate conduit opening, and a pair of inlet interior row openings. The inlet channel opening is disposed on a front end of the inlet chassis manifold, the pair of inlet interior row openings is disposed near to a distal end of the inlet chassis manifold and the at least one inlet interior plate conduit opening disposed between the pair of inlet interior row openings and the inlet channel opening. According to another aspect of the present disclosure, the outlet chassis manifold comprises an outlet channel, an outlet channel opening, at least one outlet interior plate conduit opening, and a pair of outlet interior row openings. The outlet channel opening is disposed on a front end of the outlet chassis manifold, the pair of outlet interior row openings is disposed near to a distal end of the outlet chassis manifold, and the at least one outlet interior plate conduit opening is disposed between the pair of outlet interior row openings and the outlet channel opening. In the illustrated embodiments, the inlet channel opening is in fluid communication with the at least one inlet interior plate conduit opening and the pair of inlet interior row openings, respectively, and the outlet channel opening is in fluid communication with the at least one outlet interior plate conduit opening and the pair of outlet interior row openings, respectively. The inlet channel opening and the outlet channel opening are disposed near to the front base plate, respectively.

According to yet another aspect of the present disclosure, wherein the inlet chassis manifold comprises an inlet channel, an inlet channel opening, at least one inlet interior plate conduit opening, and a pair of inlet interior row openings and the outlet chassis manifold comprises an outlet channel, an outlet channel opening, at least one outlet interior plate conduit opening, and a pair of outlet interior row openings, the at least one liquid plate heat exchanger is in fluid communication with the inlet chassis manifold and outlet chassis manifold via the at least one inlet interior plate conduit opening and at least one outlet interior plate conduit opening, respectively.

According to yet another aspect of the present disclosure, wherein the inlet chassis manifold comprises an inlet channel, an inlet channel opening, at least one inlet interior plate conduit opening, and a pair of inlet interior row openings and the outlet chassis manifold comprises an outlet channel, an outlet channel opening, at least one outlet interior plate conduit opening, and a pair of outlet interior row openings, the liquid row heat sink is in fluid communication with the inlet chassis manifold and outlet chassis manifold via the pair of inlet interior row openings and the pair of outlet interior row openings, respectively.

In further certain embodiments, wherein the inlet chassis manifold comprises an inlet channel, an inlet channel opening, at least one inlet interior plate conduit opening, and a pair of inlet interior row openings and the outlet chassis manifold comprises an outlet channel, an outlet channel opening, at least one outlet interior plate conduit opening, and a pair of outlet interior row openings, the liquid row heat sink is configured to lower a flowthrough temperature of ambient airflow flowing through the liquid row heat sink via the cooling fluid flowing through the liquid row heat sink to the outlet chassis manifold and through the outlet channel opening, and the at least one liquid plate heat exchanger transports heat away from the at least one heat generating component via the cooling fluid flowing through the at least one heat generating component to the outlet chassis manifold and through the outlet channel opening.

According to another aspect of the present disclosure, the liquid row heat sink further comprises at least a pair of airflow optimizers disposed on opposing sides of the liquid row heat sink. The pair of airflow optimizers face the front base plate end and the distal base plate end, respectively. In the illustrated embodiments, the liquid row heat sink lowers the flowthrough temperature of ambient airflow flowing through the liquid row heat sink when a fluid temperature of the cooling fluid flowing through the liquid row heat sink is configured such that a surrounding temperature of ambient air surrounding the liquid row heat sink is lower than a flowthrough temperature of ambient airflow flowing through the liquid row heat sink, and a resulting temperature of ambient airflow leaving the liquid row heat sink is lowered. The pair of airflow optimizers optimize airflow flowing from the distal base plate end, passing through the at least one electronics module, and passing through the front base plate end.

According to yet another aspect of the present disclosure, wherein the inlet chassis manifold comprises the inlet channel, the inlet channel opening, the at least one inlet interior plate conduit opening, and the pair of inlet interior row openings and the outlet chassis manifold comprises the outlet channel, the outlet channel opening, the at least one outlet interior plate conduit opening, and the pair of outlet interior row openings, the at least one electronics module comprises a first electronics module having a first heat generating component mounted thereon and a second electronics module having a second heat generating component mounted thereon. The first electronics module and second electronics module are mounted to the base plate, respectively. According to yet another aspect of the present disclosure, the at least one liquid plate heat exchanger comprises a first liquid plate heat exchanger and a second liquid plate heat exchanger. The first liquid plate heat exchanger and the second liquid plate heat exchanger are mounted to the first heat generating component and second heat generating component, respectively. According to yet another aspect of the present disclosure, the at least one inlet interior plate conduit opening comprises a first inlet interior plate conduit opening and a second inlet interior plate conduit opening. The first inlet interior plate conduit opening is disposed between the pair of inlet interior row openings and the inlet channel opening and the second inlet interior plate conduit opening is disposed between the first interior row opening and the inlet channel opening. According to yet another aspect of the present disclosure, the at least one outlet interior plate conduit opening comprises a first outlet interior plate conduit opening and a second outlet interior plate conduit opening. The first outlet interior plate conduit opening is disposed between the pair of outlet interior row openings and the outlet channel opening and the second outlet interior plate conduit opening is disposed between the first interior row opening and the outlet channel opening. The first liquid plate heat exchanger thermally couples to the first heat generating component and the second liquid plate heat exchanger thermally couples to the second heat generating component. The first liquid plate heat exchanger and the second liquid plate heat exchanger are in fluid communication with the inlet chassis manifold and outlet chassis manifold, respectively, via the first inlet interior plate conduit opening and second inlet interior plate conduit opening and first outlet interior plate conduit opening and second outlet interior plate conduit opening, respectively. The liquid row heat sink is in fluid communication with the inlet chassis manifold and outlet chassis manifold via the pair of inlet interior row openings and the pair of outlet interior row openings, respectively. The first liquid plate heat exchanger and the second liquid plate heat exchanger transport heat away from the first heat generating component and second heat generating component, respectively.

According to yet another aspect of the present disclosure, wherein the inlet chassis manifold comprises the inlet channel, the inlet channel opening, the at least one inlet interior plate conduit opening, and the pair of inlet interior row openings, the outlet chassis manifold comprises the outlet channel, the outlet channel opening, the at least one outlet interior plate conduit opening, and the pair of outlet interior row openings, and the at least one electronics module comprises a first electronics module having a first heat generating component mounted thereon and a second electronics module having a second heat generating component mounted thereon, the liquid row heat sink is configured to lower a flowthrough temperature of ambient airflow flowing through the liquid row heat sink via the cooling fluid flowing through the liquid row heat sink to the outlet chassis manifold and through the outlet channel opening. The first liquid plate heat exchanger and the second liquid plate heat exchanger transport heat away from the first heat generating component and second heat generating component, respectively, via the cooling fluid flowing through the first liquid plate heat exchanger and the second liquid plate heat exchanger, respectively, to the outlet chassis manifold and through the outlet channel opening.

According to yet another aspect of the present disclosure, wherein the at least one electronics module comprises a first electronics module having a first heat generating component mounted thereon and a second electronics module having a second heat generating component mounted thereon, the first electronics module is attached to the base plate between the liquid row heat sink and front base plate end and the second electronics module is attached to the base plate between the first electronics module and front base plate end. According to yet another aspect of the present disclosure, the second electronics module, first electronics module, and liquid row heat sink are parallel arranged. The parallel arrangement of the second electronics module, first electronics module, and liquid row heat sink is configured such that a cooling power of the cooling fluid flowing through the second electronics module, first electronics module, and liquid row heat sink, from the inlet chassis manifold, respectively, is evenly distributed to the second electronics module, first electronics module, and liquid row heat sink, respectively.

According to another aspect of the present disclosure, an amount of the at least one electronics module having at least one heat generating component mounted thereon and an amount of the at least one liquid plate heat exchanger mounted to the at least one heat generating component is greater than two, respectively. According to another aspect of the present disclosure, an amount of the a liquid row heat sink attached to the base plate is greater than one.

According to another aspect of the present disclosure, the at least one liquid plate heat exchanger is in fluid communication with the inlet chassis manifold and outlet chassis manifold, respectively, via a tubing, respectively, and the liquid row heat sink is in fluid communication with the inlet chassis manifold and outlet chassis manifold, respectfully, via a barbed fitting, respectively. In the illustrated embodiment, each of the tubings comprises no more than one bend from the at least one liquid plate heat exchanger to the inlet chassis manifold and outlet chassis manifold, respectively.

According to yet another aspect of the present disclosure, wherein the at least one liquid plate heat exchanger and the liquid row heat sink are in fluid communication with the inlet chassis manifold and outlet chassis manifold, respectively, via the tubings and the barbed fittings, respectively, the first side plate and second side plate each comprise a plurality of cut-outs. Each of the plurality of cut-outs is configured such that the tubing fluidly communicating the at least one liquid plate heat exchanger with the inlet chassis manifold and outlet chassis manifold, respectively, comprise no more than one bend from the at least one liquid plate heat exchanger to the inlet chassis manifold and outlet chassis manifold, respectively. Each of the plurality of cut-outs is configured such that the barbed fitting fluidly communicates the liquid row heat sink with the inlet chassis manifold and outlet chassis manifold, respectfully, directly.

BRIEF DESCRIPTION OF THE DRAWINGS

The following figures are included to illustrate certain aspects of the embodiments, and should not be viewed as exclusive embodiments. The subject matter disclosed is capable of considerable modifications, alterations, combinations, and equivalents in form and function, as will occur to those skilled in the art and having the benefit of this disclosure.

DETAILED DESCRIPTION

Figure 1:
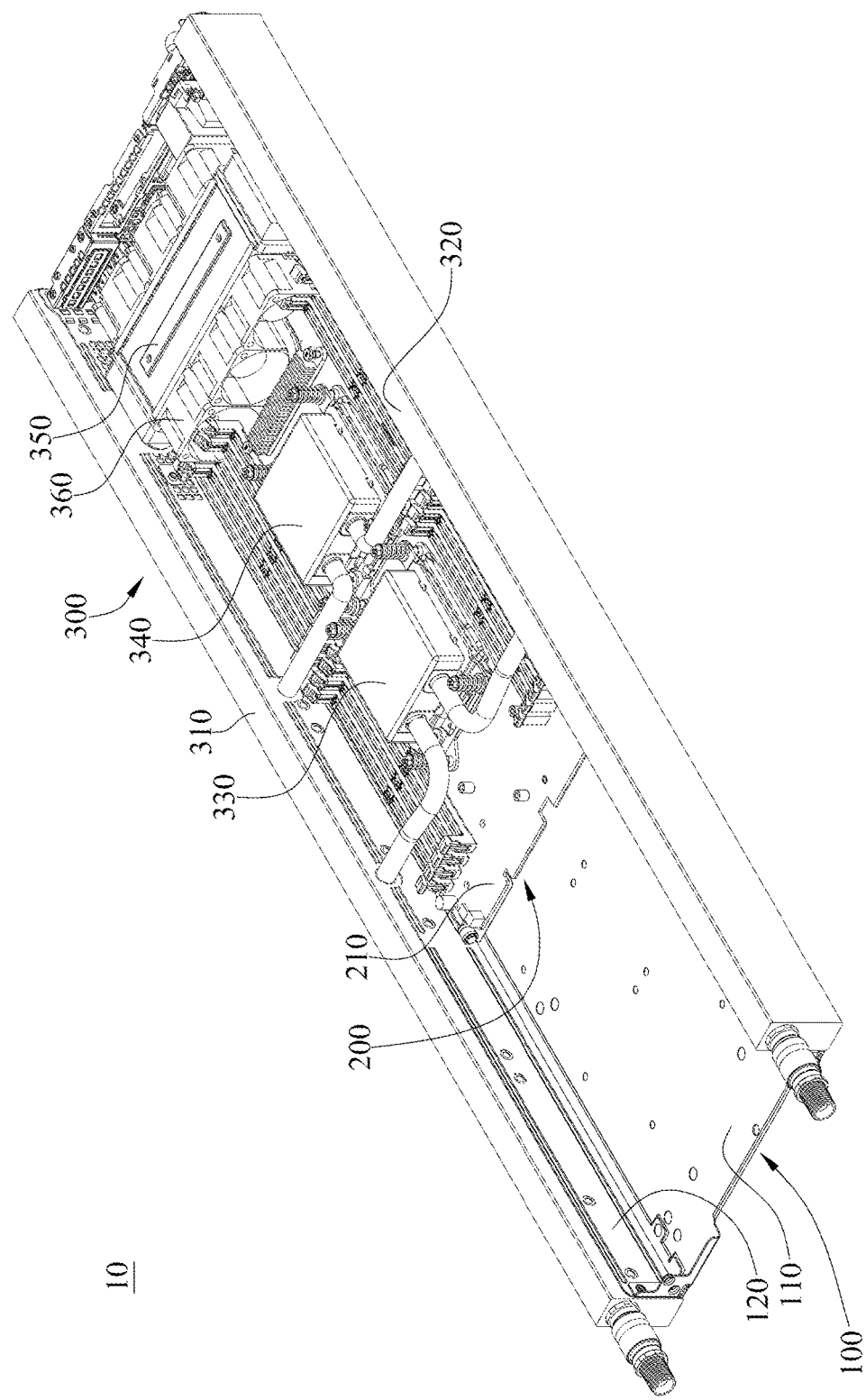
FIG. 1 is a perspective view of a liquid cooled server chassis, according to disclosed embodiments.

The following describes various principles related to liquid cooling systems by way of reference to specific examples of liquid cooling server chassis', including specific arrangements and examples of liquid plate heat exchangers and liquid row heat sinks embodying innovative concepts. More particularly, but not exclusively, such innovative principles are described in relation to selected examples of inlet chassis manifolds and outlet chassis manifolds and well-known functions or constructions are not described in detail for purposes of succinctness and clarity. Nonetheless, one or more of the disclosed principles can be incorporated in various other embodiments of liquid plate heat exchangers, liquid row heat sinks, inlet chassis manifolds, and outlet chassis manifolds to achieve any of a variety of desired outcomes, characteristics, and/or performance criteria.

Thus, liquid cooled server chassis' having attributes that are different from those specific examples discussed herein can embody one or more of the innovative principles, and can be used in applications not described herein in detail. Accordingly, embodiments not described herein in detail also fall within the scope of this disclosure, as will be appreciated by those of ordinary skill in the relevant art following a review of this disclosure.

In the illustrated embodiments, the liquid cooled server chassis' may be high-density equipment rack-mounted assemblies, such as servers. The liquid cooled server chassis' (servers), for example, may be configured to be received in chassis-receiving bays of an equipment support frame of a server rack (not shown). Each of the liquid cooled server chassis' (servers), may be horizontally slidable on vertically stacked rails mounted to the equipment support frame. A number of server racks, for example, may in turn be housed together in a high-density electronic equipment facility or data center (not shown). The liquid cooled server chassis' (servers), comprise at least one heat generating component requiring cooling. For cooling, a system of conduits has an inlet channel opening (inlet port) and an outlet channel opening (outlet port) for connecting to a cooling liquid supply (not shown) to receive direct intake/flow of cooling fluid. Examples of cooling liquid supplies comprise coolant distribution units (CDUs) having, as an example, manifolds, rear door heat exchangers and/or a reservoir pumping unit (RPU). For clarity of illustration, the liquid cooled server chassis (server) is simplified, and in practice, can be varied.

Example embodiments as disclosed herein are directed to liquid cooled server chassis' comprising a chassis, at least one electronics module having at least one heat generating component mounted thereon, and a liquid cooling unit, having at least one liquid plate heat exchanger, a liquid row heat sink, an inlet chassis manifold, and an outlet chassis manifold. The at least one liquid plate heat exchanger is mounted and thermally coupled to the at least one heat generating component and is in fluid communication with the inlet chassis manifold and outlet chassis manifold. The at least one liquid plate heat exchanger transports heat away from the at least one heat generating component. The liquid row heat sink, in fluid communication with the inlet chassis manifold and outlet chassis manifold, is configured to lower a flowthrough temperature of ambient airflow flowing through the liquid row heat sink. The at least one electronics module and liquid row heat sink are parallel arranged, whereby cooling power is evenly distributed thereamong.

Figure 2:
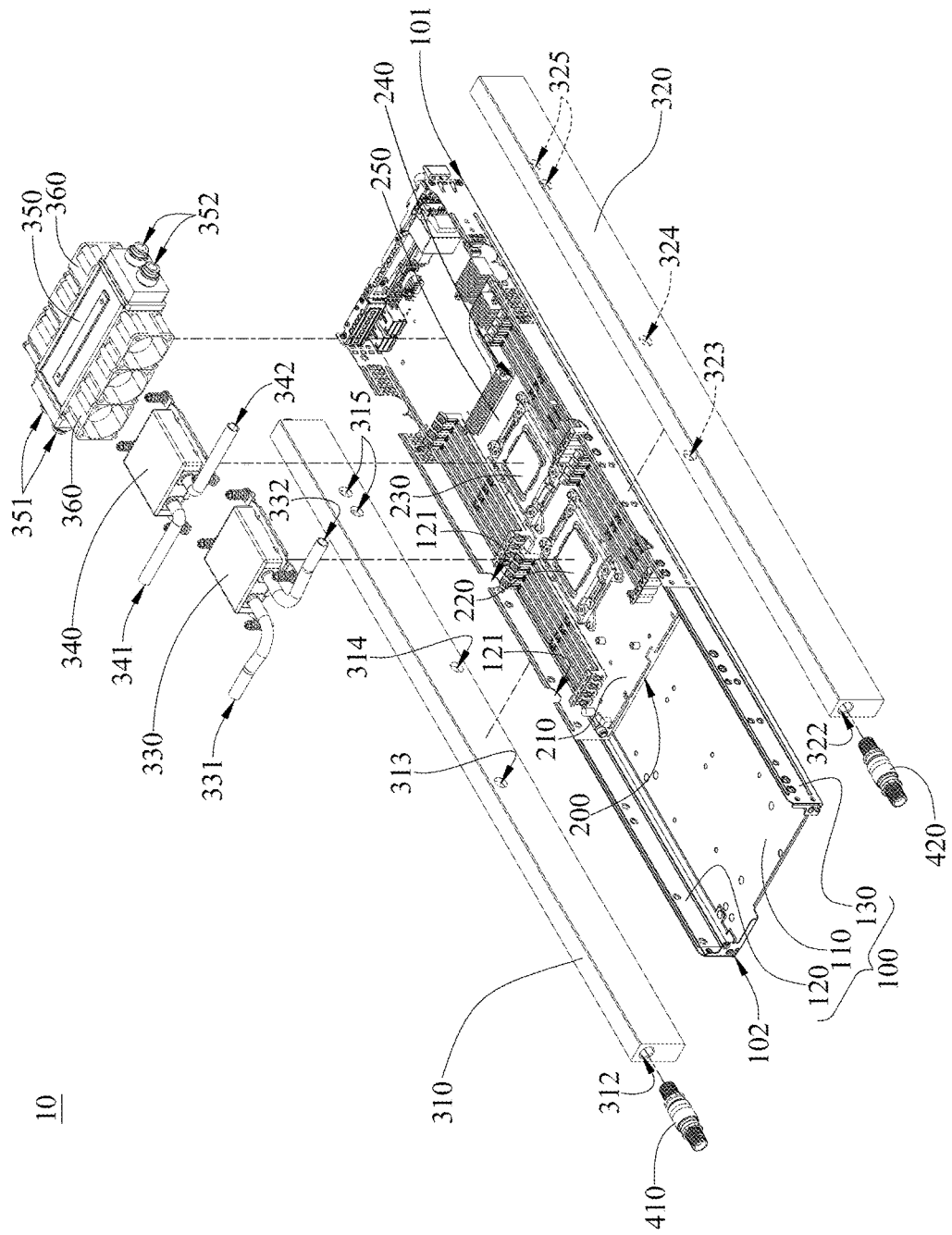
FIG. 2 illustrates a partially exploded view of the liquid cooled server chassis of FIG. 1, according to disclosed embodiments.
Figure 3:
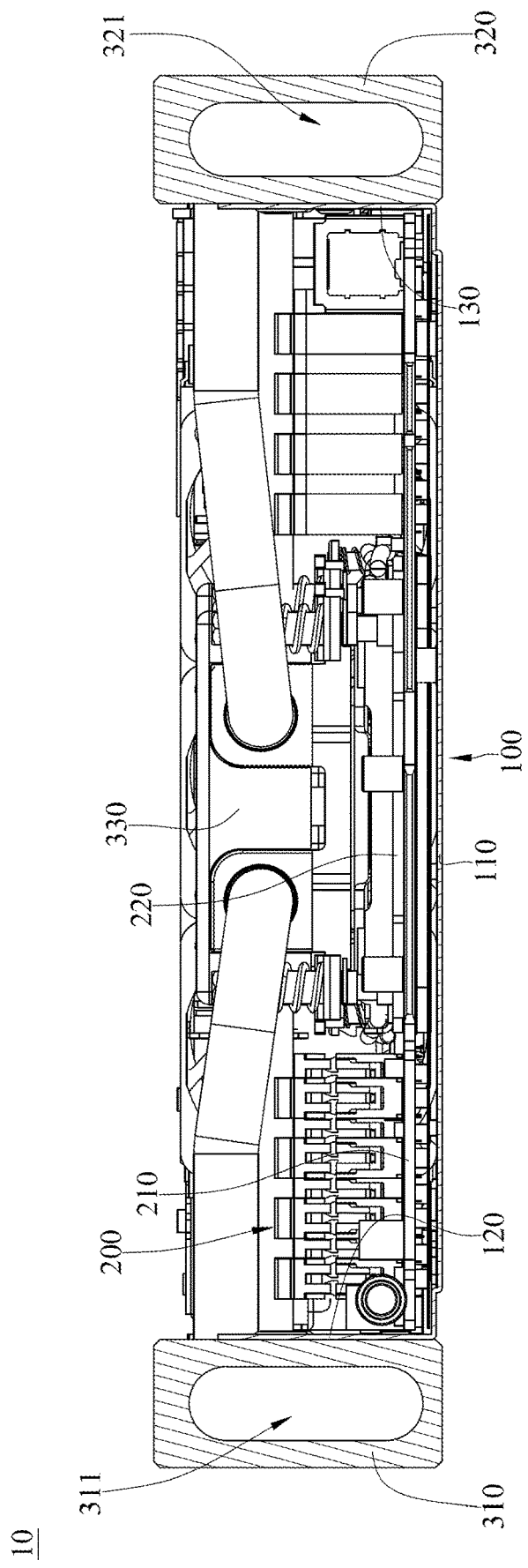
FIG. 3 is a cross-sectional view illustrating features of the liquid cooled server chassis of FIG. 1, according to disclosed embodiments.

FIG. 1 is a perspective view of a liquid cooled server chassis 10, according to disclosed embodiments. FIG. 2 illustrates a partially exploded view of the liquid cooled server chassis 10 of FIG. 1, according to disclosed embodiments. FIG. 3 is a cross-sectional view illustrating features of the liquid cooled server chassis 10 of FIG. 1, according to disclosed embodiments. As illustrated in FIGS. 1-3, a liquid cooled server chassis 10 comprising a chassis 100, at least one electronics module 240, and a liquid cooling unit 300, is provided. The chassis 100 has a base plate 110, a first side plate 120, and a second side plate 130. The base plate 110 has a front base plate end 102 and a distal base plate end 101. The first side plate 120 is connected to the second side plate 130 via the base plate 110 and the first side plate 120 and the second side plate 130 are between the front base plate end 102 and the distal base plate end 101, respectively. The at least one electronics module 240 has at least one heat generating component 230 mounted thereon and is attached to the base plate 110 between the distal base plate end 101 and front base plate end 102. The liquid cooling unit 300 is configured to be flow through by a cooling fluid and comprises at least one liquid plate heat exchanger 340, a liquid row heat sink 350, an inlet chassis manifold 310, and an outlet chassis manifold 320. The at least one liquid plate heat exchanger 340 is mounted to the at least one heat generating component 230. The liquid row heat sink 350 is attached to the base plate 110 near to the distal base plate end 101 between the distal base plate end 101 and at least one electronics module 240. The inlet chassis manifold 310 is fixed to the first side plate 120 and the outlet chassis manifold 320 is fixed to the second side plate 130. The at least one liquid plate heat exchanger 340 is thermally coupled to the at least one heat generating component 230 and the at least one liquid plate heat exchanger 340 is in fluid communication with the inlet chassis manifold 310 and outlet chassis manifold 320, respectively, whereby the at least one liquid plate heat exchanger 340 transports heat away from the at least one heat generating component 230. The liquid row heat sink 350 is in fluid communication with the inlet chassis manifold 310 and outlet chassis manifold 320, respectfully, wherein the liquid row heat sink 350 is configured to lower a flowthrough temperature of ambient airflow flowing through the liquid row heat sink 350.

As illustrated, a shape of the liquid cooled server chassis 10 comprises a cuboid shape having a base and at least two opposing lateral sides, whereby the base comprises the base plate 110 and the at least two opposing lateral sides comprise the first side plate 120 and the second side plate 130, respectively.

As illustrated, the at least one heat generating component 230 mounted to the at least one electronics module 240 comprises a processor, and in certain embodiments the processor comprises a central processing unit (CPU).

As illustrated, the at least one liquid plate heat exchanger 340 is a liquid cold plate, and as illustrated, the liquid row heat sink 350 is a water-cooled heat sink row.

Figure 4:
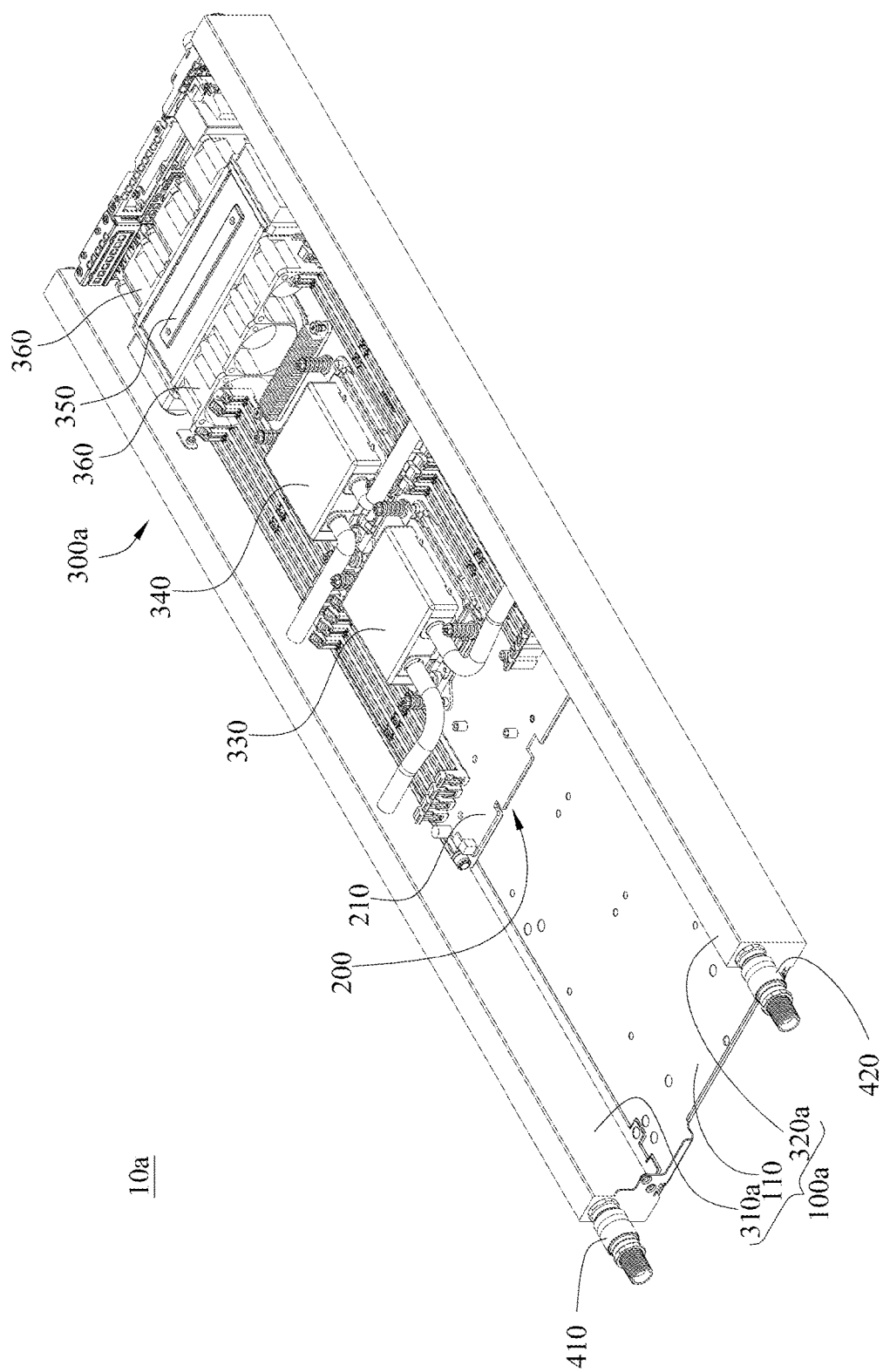
FIG. 4 is a perspective view of another embodiment of a disclosed liquid cooled server chassis.
Figure 5:
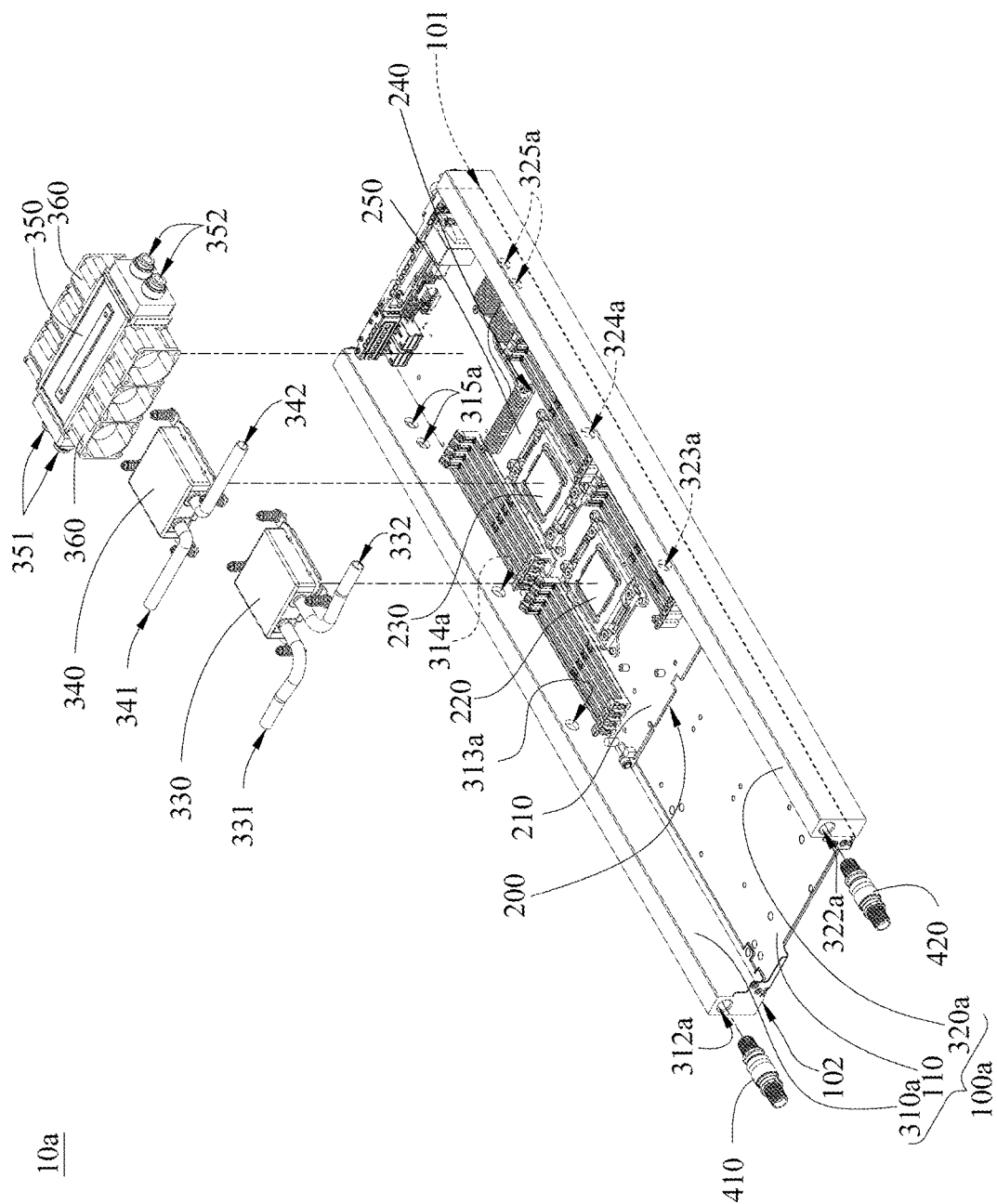
FIG. 5 illustrates a partially exploded view of the liquid cooled server chassis of FIG. 4, according to disclosed embodiments.
Figure 6:
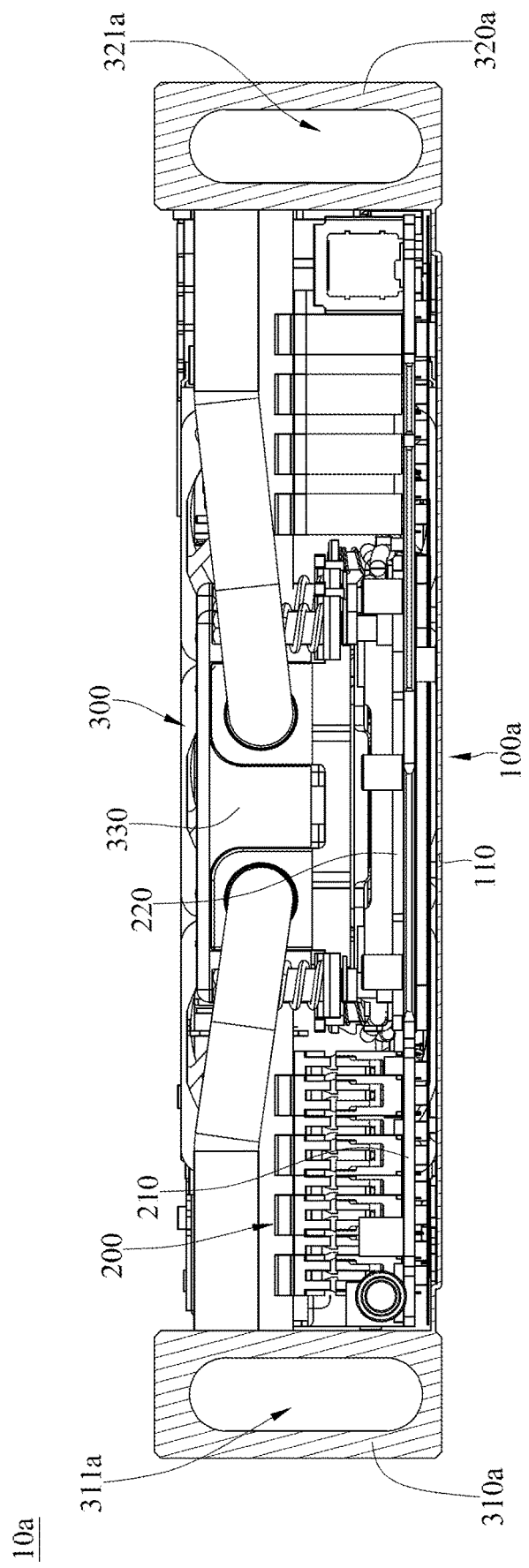
FIG. 6 is a cross-sectional view illustrating features of the liquid cooled server chassis of FIG. 4, according to disclosed embodiments.

In the illustrated embodiments, the inlet chassis manifold 310 is fixed to the first side plate 120 and the outlet chassis manifold 320 is fixed to the second side plate 130; however, the embodiments are not limited thereto. FIG. 4 is a perspective view of another embodiment of a disclosed liquid cooled server chassis 10a. FIG. 5 is a cross-sectional view illustrating features of the liquid cooled server chassis of FIG. 4, according to disclosed embodiments. FIG. 6 is a cross-sectional view illustrating features of the liquid cooled server chassis of FIG. 4, according to disclosed embodiments. As illustrated in FIGS. 4-6 and as illustrated in FIGS. 1-3, as illustrated, the inlet chassis manifold 310 comprises an external inlet manifold lateral side and a first inlet manifold lateral side, opposite the external inlet manifold lateral side. As illustrated, the first inlet manifold lateral side of the inlet chassis manifold 310 is fixed to the first side plate 120. In the illustrated embodiments, the first inlet manifold lateral side of the inlet chassis manifold 310a is integrally formed with the first side plate. In certain embodiments, the external inlet manifold lateral side is fixed to the first side plate 120. In certain embodiments, the external inlet manifold lateral side of the inlet chassis manifold 310a is integrally formed with the first side plate. As illustrated, the outlet chassis manifold 320 comprises an external outlet manifold lateral side and a second outlet manifold lateral side, opposite the external outlet manifold lateral side. As illustrated, the second outlet manifold lateral side is fixed to the second side plate 130. In the illustrated embodiments, the outlet chassis manifold 320a is integrally formed with the second side plate. In certain embodiments, the external outlet manifold lateral side of the outlet chassis manifold 320 is fixed to the second side plate 130. In the illustrated embodiments, the external outlet manifold lateral side of the outlet chassis manifold 320a is integrally formed with the second side plate.

As illustrated, an exterior shape of the inlet chassis manifold 310 and the outlet chassis manifold 320 comprises a cuboid shape, respectively; however, the embodiments are not limited thereto. The exterior shape of the inlet chassis manifold 310 and the outlet chassis manifold 320 may comprise a non-cuboid shape. In the illustrated embodiments, the external inlet manifold lateral side and external outlet manifold lateral side are configured for rail mounts to be fixed thereto, respectively. As illustrated, an interior shape of the inlet chassis manifold 310 and the outlet chassis manifold 320 comprises an ecliptic cylinder shape, respectively.

As illustrated, the inlet chassis manifold 310 comprises an inlet channel 311, an inlet channel opening 312, at least one inlet interior plate conduit opening 314, and a pair of inlet interior row openings 315. The inlet channel opening 312 is disposed on a front end of the inlet chassis manifold 310, the inlet interior row opening 315 is disposed near to a distal end of the inlet chassis manifold 310 and the at least one inlet interior plate conduit opening 314 is disposed between the inlet interior row opening 315 and the inlet channel opening 312. As illustrated, the outlet chassis manifold 320 comprises an outlet channel 321, an outlet channel opening 322, at least one outlet interior plate conduit opening 324, and an outlet interior row opening 325. The outlet channel opening 322 is disposed on a front end of the outlet chassis manifold 320, the outlet interior row opening 325 is disposed near to a distal end of the outlet chassis manifold 320, and the at least one outlet interior plate conduit opening 324 is disposed between the outlet interior row opening 325 and the outlet channel opening 322. In the illustrated embodiments, the inlet channel opening 312 is in fluid communication with the at least one inlet interior plate conduit opening 314 and the inlet interior row opening 315, respectively, and the outlet channel opening 322 is in fluid communication with the at least one outlet interior plate conduit opening 324 and the outlet interior row opening 325, respectively. The inlet channel opening 312 and the outlet channel opening 322 are disposed near to the front base plate 110, respectively.

In the illustrated embodiments, wherein the inlet chassis manifold 310 comprises an inlet channel 311, an inlet channel opening 312, at least one inlet interior plate conduit opening 314, and a pair of inlet interior row openings 315 and the outlet chassis manifold 320 comprises an outlet channel 321, an outlet channel opening 322, at least one outlet interior plate conduit opening 324, and an outlet interior row opening 325, the at least one liquid plate heat exchanger 340 is in fluid communication with the inlet chassis manifold 310 and outlet chassis manifold 320 via the at least one inlet interior plate conduit opening 314 and at least one outlet interior plate conduit opening 324, respectively.

In the illustrated embodiments, wherein the inlet chassis manifold 310 comprises an inlet channel 311, an inlet channel opening 312, at least one inlet interior plate conduit opening 314, and a pair of inlet interior row openings 315 and the outlet chassis manifold 320 comprises an outlet channel 321, an outlet channel opening 322, at least one outlet interior plate conduit opening 324, and an outlet interior row opening 325, the liquid row heat sink 350 is in fluid communication with the inlet chassis manifold 310 and outlet chassis manifold 320 via the inlet interior row opening 315 and the outlet interior row opening 325, respectively.

In further certain embodiments, wherein the inlet chassis manifold 310 comprises an inlet channel 311, an inlet channel opening 312, at least one inlet interior plate conduit opening 314, and a pair of inlet interior row openings 315 and the outlet chassis manifold 320 comprises an outlet channel 321, an outlet channel opening 322, at least one outlet interior plate conduit opening 324, and an outlet interior row opening 325, the liquid row heat sink 350 is configured to lower a flowthrough temperature of ambient airflow flowing through the liquid row heat sink 350 via the cooling fluid flowing through the liquid row heat sink 350 to the outlet chassis manifold 320 and through the outlet channel opening 322, and the at least one liquid plate heat exchanger 340 transports heat away from the at least one heat generating component 230 via the cooling fluid flowing through the at least one heat generating component 230 to the outlet chassis manifold 320 and through the outlet channel opening 322.

As illustrated, the liquid row heat sink 350 further comprises at least a pair of airflow optimizers 360 disposed on opposing sides of the liquid row heat sink 350. The pair of airflow optimizers 360 face the front base plate end 102 and the distal base plate end 101, respectively. In the illustrated embodiments, the liquid row heat sink 350 lowers the flowthrough temperature of ambient airflow flowing through the liquid row heat sink 350 when a fluid temperature of the cooling fluid flowing through the liquid row heat sink 350 is configured such that a surrounding temperature of ambient air surrounding the liquid row heat sink 350 is lower than a flowthrough temperature of ambient airflow flowing through the liquid row heat sink 350, and a resulting temperature of ambient airflow leaving the liquid row heat sink 350 is lowered. As an example, a fluid temperature range of the cooling fluid flowing through the liquid row heat sink 350 comprises 15 to 20 degrees Celsius. The pair of airflow optimizers 360 is configured to optimize airflow flowing from the distal base plate end 101, passing through the at least one electronics module 240, and passing through the front base plate end 102; however, the embodiments are not limited thereto. In certain embodiments, the pair of airflow optimizers 360 is configured to accelerate airflow flowing from the distal base plate end 101, passing through the at least one electronics module 240, and passing through the front base plate end 102, and in certain embodiments, the pair of airflow optimizers 360 is configured to generate airflow flowing from the distal base plate end 101, passing through the at least one electronics module 240, and passing through the front base plate end 102. The lowered resulting temperature of ambient airflow leaving the liquid row heat sink 350, passing through the at least one electronics module 240, transfers heat away from the at least one heat generating component 230 and other heat generating components of the at least one electronics module 240, as an example, memory modules, and improves heat dissipation efficiency of the liquid cooled server chassis 10.

In the illustrated embodiments, wherein the inlet chassis manifold 310 comprises the inlet channel 311, the inlet channel opening 312, the at least one inlet interior plate conduit opening 314, and the inlet interior row opening 315 and the outlet chassis manifold 320 comprises the outlet channel 321, the outlet channel opening 322, the at least one outlet interior plate conduit opening 324, and the outlet interior row opening 325, the at least one electronics module 240 comprises a first electronics module 240 having a first heat generating component 230 mounted thereon and a second electronics module 200 having a second heat generating component 220 mounted thereon. The first electronics module 240 and the second electronics module 200 are mounted to the base plate 110, respectively. In the illustrated embodiments, the at least one liquid plate heat exchanger 340 comprises a first liquid plate heat exchanger 340 and a second liquid plate heat exchanger 330. The first liquid plate heat exchanger 340 and the second liquid plate heat exchanger 330 are mounted to the first heat generating component 230 and second heat generating component 220, respectively. In the illustrated embodiments, the at least one inlet interior plate conduit opening 314 comprises a first inlet interior plate conduit opening 314 and a second inlet interior plate conduit opening 313. The first inlet interior plate conduit opening 314 is disposed between the inlet interior row opening 315 and the inlet channel opening 312 and the second inlet interior plate conduit opening 313 is disposed between the first interior row opening and the inlet channel opening 312. In the illustrated embodiments, the at least one outlet interior plate conduit opening 324 comprises a first outlet interior plate conduit opening 324 and a second outlet interior plate conduit opening 323. The first outlet interior plate conduit opening 324 is disposed between the outlet interior row opening 325 and the outlet channel opening 322 and the second outlet interior plate conduit opening 323 is disposed between the first interior row opening and the outlet channel opening 322. The first liquid plate heat exchanger 340 thermally couples to the first heat generating component 230 and the second liquid plate heat exchanger 330 thermally couples to the second heat generating component 220. The first liquid plate heat exchanger 340 and the second liquid plate heat exchanger 330 are in fluid communication with the inlet chassis manifold 310 and outlet chassis manifold 320, respectively, via the first inlet interior plate conduit opening 314 and second inlet interior plate conduit opening 313 and first outlet interior plate conduit opening 324 and second outlet interior plate conduit opening 323, respectively. The liquid row heat sink 350 is in fluid communication with the inlet chassis manifold 310 and outlet chassis manifold 320 via the inlet interior row opening 315 and the outlet interior row opening 325, respectively. The first liquid plate heat exchanger 340 and the second liquid plate heat exchanger 330 transport heat away from the first heat generating component 230 and second heat generating component 220, respectively.

In the illustrated embodiments, wherein the inlet chassis manifold 310 comprises the inlet channel 311, the inlet channel opening 312, the second interior plate conduit opening 313, first interior plate conduit opening 314, and the inlet interior row opening 315, the outlet chassis manifold 320 comprises the outlet channel 321, the outlet channel opening 322, the second outlet interior plate conduit opening 323, the first outlet interior plate conduit opening 324, and the outlet interior row opening 325, and the at least one electronics module 240 comprises a first electronics module 240 having a first heat generating component 230 mounted thereon and a second electronics module 200 having a second heat generating component 220 mounted thereon, the liquid row heat sink 350 is configured to lower a flowthrough temperature of ambient airflow flowing through the liquid row heat sink 350 via the cooling fluid flowing through the liquid row heat sink 350 to the outlet chassis manifold 320 and through the outlet channel opening 322. The first liquid plate heat exchanger 340 and the second liquid plate heat exchanger 330 transport heat away from the first heat generating component 230 and second heat generating component 220, respectively, via the cooling fluid flowing through the first liquid plate heat exchanger 340 and the second liquid plate heat exchanger 330, respectively, to the outlet chassis manifold 320 and through the outlet channel opening 322.

In the illustrated embodiments, the liquid cooled server chassis 10 further comprises an inlet chassis manifold quick release connector 410 and an outlet chassis manifold quick release connector 420. The inlet chassis manifold quick release connector 410 and an outlet chassis manifold quick release connector 420 are configured for easy and quick mounting to the inlet channel opening 312 and outlet channel opening 322, respectively, on one end of the inlet chassis manifold quick release connector 410 and the outlet chassis manifold quick release connector 420, respectively, and for easy and quick mounting to a cooling liquid supply (not shown) to receive direct intake/flow of cooling fluid, respectively, on an opposite end of the inlet chassis manifold quick release connector 410 and the outlet chassis manifold quick release connector 420, respectively.

In the illustrated embodiments, wherein the at least one electronics module 240 comprises a first electronics module 240 having a first heat generating component 230 mounted thereon and a second electronics module 200 having a second heat generating component 220 mounted thereon, the first electronics module 240 is attached to the base plate 110 between the liquid row heat sink 350 and front base plate end 102 and the second electronics module 200 is attached to the base plate 110 between the first electronics module 240 and front base plate end 102. In the illustrated embodiments, the second electronics module 200, first electronics module 240, and liquid row heat sink 350 are parallel arranged. The parallel arrangement of the second electronics module 200, first electronics module 240, and liquid row heat sink 350 is configured such that a cooling power of the cooling fluid flowing through the second electronics module 200, first electronics module 240, and liquid row heat sink 350, from the inlet chassis manifold 310, respectively, is evenly distributed to the second electronics module 200, first electronics module 240, and liquid row heat sink 350, respectively.

In the illustrated embodiments, wherein the liquid row heat sink 350 further comprises at least a pair of airflow optimizers 360 disposed on opposing sides of the liquid row heat sink 350, the liquid row heat sink 350 lowers the flowthrough temperature of ambient airflow flowing through the liquid row heat sink 350 when a fluid temperature of the cooling fluid flowing through the liquid row heat sink 350 is configured such that a surrounding temperature of ambient air surrounding the liquid row heat sink 350 is lower than a flowthrough temperature of ambient airflow flowing through the liquid row heat sink 350, and a resulting temperature of ambient airflow leaving the liquid row heat sink 350 is lowered. As an example, a fluid temperature range of the cooling fluid flowing through the liquid row heat sink 350 comprises 15 to 20 degrees Celsius. The pair of airflow optimizers 360 is configured to optimize airflow flowing from the distal base plate end 101, passing through the first electronics module 230 and the second electronics module 220, and passing through the front base plate end 102; however, the embodiments are not limited thereto. In the illustrated embodiments, the pair of airflow optimizers 360 is configured to accelerate airflow flowing from the distal base plate end 101, passing through the first electronics module 230 and the second electronics module 220, and passing through the front base plate end 102, and in the illustrated embodiments, the pair of airflow optimizers 360 is configured to generate airflow flowing from the distal base plate end 101, passing through the first electronics module 230 and the second electronics module 220, and passing through the front base plate end 102. The lowered resulting temperature of ambient airflow leaving the liquid row heat sink 350, passing through the first electronics module 230 and the second electronics module 220, transfers heat away from the first electronics module 230 and the second electronics module 220 and other heat generating components of the first electronics module 230 and the second electronics module 220, as an example, memory modules, respectively, and improves heat dissipation efficiency of the liquid cooled server chassis 10.

As illustrated, the at least one electronics module 240 further comprises a first motherboard 250, whereby the at least one heat generating component 230 is mounted to the first motherboard 250. In the illustrated embodiments, the first electronics module 240 further comprises a first motherboard 250, whereby the first heat generating component 230 is mounted to the first motherboard 250, and the second electronics module 200 further comprises a second motherboard 210, whereby the second heat generating component 220 is mounted to the second motherboard 210.

As illustrated, an amount of the at least one electronics module 240 having at least one heat generating component 230 mounted thereon and an amount of the at least one liquid plate heat exchanger 340 mounted to the at least one heat generating component 230 is greater than two, respectively. As illustrated, an amount of the a liquid row heat sink 350 attached to the base plate 110 is greater than one.

As illustrated, the at least one liquid plate heat exchanger 340 is in fluid communication with the inlet chassis manifold 310 and outlet chassis manifold 320, respectively, via a tubing 341, 342, respectively, and the liquid row heat sink 350 is in fluid communication with the inlet chassis manifold 310 and outlet chassis manifold 320, respectfully, via a barbed fitting 351, 352, respectively. In the illustrated embodiments, the second liquid plate heat exchanger 330 and the first liquid plate heat exchanger 340 are in fluid communication with the inlet chassis manifold 310 and outlet chassis manifold 320, respectively, via a tubing 341, 342, 331, 332, respectively, and the liquid row heat sink 350 is in fluid communication with the inlet chassis manifold 310 and outlet chassis manifold 320, respectfully, via a barbed fitting 351, 352, respectively. As illustrated, each of the tubings 341, 342 comprises no more than one bend from the at least one liquid plate heat exchanger 340 to the inlet chassis manifold 310 and outlet chassis manifold 320, respectively. In the illustrated embodiments, each of the tubings 341, 342, 331, 332 comprises no more than one bend from the second liquid plate heat exchanger 330 and the first liquid plate heat exchanger 340, respectively, to the inlet chassis manifold 310 and outlet chassis manifold 320, respectively.

In the illustrated embodiments, the disposition of the second liquid plate heat exchanger 330 and the first liquid plate heat exchanger 340 between the inlet chassis manifold 310 and outlet chassis manifold 320, respectively, allowing each of the tubings 341, 342, 331, 332 to be bent only once, decreases the number of kinks from forming in the tubings 341, 342, 331, 332, which if formed, would decrease cooling efficiency of the liquid cooling unit 300 via a reduction in water flow. Also, the disposition of the second liquid plate heat exchanger 330, the first liquid plate heat exchanger 340, and the liquid row heat sink 350 between the inlet chassis manifold 310 and outlet chassis manifold 320, respectively, simplifies attachment of the second liquid plate heat exchanger 330, the first liquid plate heat exchanger 340, and the liquid row heat sink 350 to the base plate 110 and time required for attachment.

As illustrated, wherein the at least one liquid plate heat exchanger 340 and the liquid row heat sink 350 are in fluid communication with the inlet chassis manifold 310 and outlet chassis manifold 320, respectively, via the tubings 341, 342 and the barbed fittings 351, 352, respectively, the first side plate 120 and second side plate 130 each comprise a plurality of cut-outs 121. Each of the plurality of cut-outs 121 is configured such that the tubing 341, 342 fluidly communicating the at least one liquid plate heat exchanger 340 with the inlet chassis manifold 310 and outlet chassis manifold 320, respectively, comprise no more than one bend from the at least one liquid plate heat exchanger 340 to the inlet chassis manifold 310 and outlet chassis manifold 320, respectively. In the illustrated embodiments, wherein the at least one liquid plate heat exchanger 340, the second liquid plate heat exchanger 330, and the liquid row heat sink 350 are in fluid communication with the inlet chassis manifold 310 and outlet chassis manifold 320, respectively, via the tubings 341, 342, 331, 332 and the barbed fittings 351, 352, respectively, the first side plate 120 and second side plate 130 each comprise a plurality of cut-outs 121. Each of the plurality of cut-outs 121 is configured such that the tubing 341, 342, 331, 332 fluidly communicating the second liquid plate heat exchanger 330 with the inlet chassis manifold 310 and outlet chassis manifold 320, respectively, comprise no more than one bend from the second liquid plate heat exchanger 330 to the inlet chassis manifold 310 and outlet chassis manifold 320, respectively. In the illustrated embodiments, each of the plurality of cut-outs 121 is configured such that the barbed fitting 351, 352 fluidly communicates the liquid row heat sink 350 with the inlet chassis manifold 310 and outlet chassis manifold 320, respectfully, directly. As illustrated in FIGS. 4-6 and as illustrated in FIGS. 1-3, as illustrated, wherein the inlet chassis manifold 310a is integrally formed with the first side plate and the outlet chassis manifold 320a is integrally formed with the second side plate, the plurality of cut-outs 121 comprise the at least one inlet interior plate conduit opening 314, the inlet interior row opening 315, the at least one outlet interior plate conduit opening 324, and the outlet interior row opening 325. In the illustrated embodiments, wherein the inlet chassis manifold 310a is integrally formed with the first side plate and the outlet chassis manifold 320a is integrally formed with the second side plate, the plurality of cut-outs comprise the second inlet interior plate conduit opening 313a, the first interior plate conduit opening 314a, the inlet interior row opening 315a, the second outlet interior plate conduit opening 323a, the first outlet interior plate conduit opening 324a, and the outlet interior row opening 325a.

In the illustrated embodiments, the inlet chassis manifold 310 and the outlet chassis manifold 320 comprise the second inlet interior plate conduit opening 313, the first interior plate conduit opening 314, and the inlet interior row opening 315, and the second outlet interior plate conduit opening 323, the first outlet interior plate conduit opening 324, and the outlet interior row opening 325, respectively; however, the embodiments are not limited thereto. In certain embodiments the inlet chassis manifold 310 and the outlet chassis manifold 320 comprise one opening each, and the first side plate 120 and second side plate 130 each comprise one cut-out 121 each, whereby the second liquid plate heat exchanger 330, first liquid plate heat exchanger 340, and liquid row heat sink 350 is in fluid communication with the inlet chassis manifold 310 and the outlet chassis manifold 320, respectively, via, for example, a splitter. In certain embodiments the inlet chassis manifold 310 and the outlet chassis manifold 320 comprise one opening each, whereby the second liquid plate heat exchanger 330, first liquid plate heat exchanger 340, and liquid row heat sink 350 is in fluid communication with the inlet chassis manifold 310 and the outlet chassis manifold 320, respectively, via, for example, a splitter.

A liquid cooled server chassis 10 comprising a chassis 100, a first electronics module 240 having a first heat generating component 230 mounted thereon, a second electronics module 200 having a second heat generating component 220 mounted thereon, and a liquid cooling unit 300, having a first liquid plate heat exchanger 340, a second liquid plate heat exchanger 330, a liquid row heat sink 350, an inlet chassis manifold 310, and an outlet chassis manifold 320, is provided. The first liquid plate heat exchanger 340 and second liquid plate heat exchanger 330, mounted and thermally coupled to the first heat generating component 230 and second heat generating component 220, respectively, are in fluid communication with the inlet chassis manifold 310, 310a and outlet chassis manifold 320, 320a transporting heat away from the first heat generating component 230 and second heat generating component 220, respectively.

In the illustrated embodiments, the first electronics module 240, second electronics module 200, and liquid row heat sink 350 are parallel arranged. The parallel arrangement of the second electronics module 200, first electronics module 240, and liquid row heat sink 350 is configured such that a cooling power of the cooling fluid flowing through the second electronics module 200, first electronics module 240, and liquid row heat sink 350, from the inlet chassis manifold 310, respectively, is evenly distributed to the second electronics module 200, first electronics module 240, and liquid row heat sink 350, respectively. Thus, maximizing heat transfer efficiency, while simplifying the structure of the liquid cooling unit 300.

Also, the disposition of the second liquid plate heat exchanger 330 and the first liquid plate heat exchanger 340 between the inlet chassis manifold 310 and outlet chassis manifold 320, respectively, allowing each of the tubings 341, 342, 331, 332 to be bent only once, decreases the number of kinks from forming in the tubings 341, 342, 331, 332, which if formed, would decrease cooling efficiency of the liquid cooling unit 300 via a reduction in water flow. Thus, further maximizing heat transfer efficiency, without complicating the structure of the liquid cooling unit 300.

Furthermore, the disposition of the second liquid plate heat exchanger 330, the first liquid plate heat exchanger 340, and the liquid row heat sink 350 between the inlet chassis manifold 310 and outlet chassis manifold 320, respectively, simplifies attachment of the second liquid plate heat exchanger 330, the first liquid plate heat exchanger 340, and the liquid row heat sink 350 to the base plate 110 and time required for attachment. Thus, allowing for easy reassembly of the liquid cooling unit 300 during maintenance or adjustments to the number of heat generating components in the liquid cooled server chassis 10.

In the illustrated embodiments, the liquid row heat sink 350, in fluid communication with the inlet chassis manifold 310, 310a and outlet chassis manifold 320, 320a is configured to lower a flowthrough temperature of ambient airflow flowing through the liquid row heat sink 350. In the illustrated embodiments, the pair of airflow optimizers 360 is configured to accelerate airflow flowing from the distal base plate end 101, passing through the first electronics module 230 and the second electronics module 220, and passing through the front base plate end 102, and in the illustrated embodiments, the pair of airflow optimizers 360 is configured to generate airflow flowing from the distal base plate end 101, passing through the first electronics module 230 and the second electronics module 220, and passing through the front base plate end 102. The lowered resulting temperature of ambient airflow leaving the liquid row heat sink 350, passing through the first electronics module 230 and the second electronics module 220, transfers heat away from the first electronics module 230 and the second electronics module 220 and other heat generating components of the first electronics module 230 and the second electronics module 220, as an example, memory modules, respectively, and improves heat dissipation efficiency of the liquid cooled server chassis 10, 10a. Thus, efficiently air cooling other heat generating components not mounted to the liquid plate heat exchangers, without further complicating the structure of the liquid cooling unit 300.

Therefore, embodiments disclosed herein are well adapted to attain the ends and advantages mentioned as well as those that are inherent therein. The particular embodiments disclosed above are illustrative only, as the embodiments disclosed may be modified and practiced in different but equivalent manners apparent to those skilled in the art having the benefit of the teachings herein. Furthermore, no limitations are intended to the details of construction or design herein shown, other than as described in the claims below. It is therefore evident that the particular illustrative embodiments disclosed above may be altered, combined, or modified and all such variations are considered within the scope and spirit of the present disclosure. The embodiments illustratively disclosed herein suitably may be practiced in the absence of any element that is not specifically disclosed herein and/or any optional element disclosed herein. While compositions and methods are described in terms of "comprising," "containing," or "including" various components or steps, the compositions and methods can also "consist essentially of" or "consist of" the various components and steps. All numbers and ranges disclosed above may vary by some amount. Whenever a numerical range with a lower limit and an upper limit is disclosed, any number and any included range falling within the range is specifically disclosed. In particular, every range of values (of the form, "from about a to about b," or, equivalently, "from approximately a to b," or, equivalently, "from approximately a-b") disclosed herein is to be understood to set forth every number and range encompassed within the broader range of values. Also, the terms in the claims have their plain, ordinary meaning unless otherwise explicitly and clearly defined by the patentee. Moreover, the indefinite articles "a" or "an," as used in the claims, are defined herein to mean one or more than one of the element that it introduces.

What is claimed is:

1. A liquid cooled server chassis, comprising:
   a water block unit comprising:
      a chassis having a base plate, a first side plate, and a second side plate, the base plate having a front base plate end and a distal base plate end, the first side plate connected to the second side plate via the base plate, the first side plate and the second side plate between the front base plate end and the distal base plate end;
      at least one electronics module having at least one heat generating component mounted thereon, the at least one electronics module attached to the base plate between the distal base plate end and front base plate end,
      a liquid cooling unit, configured to be flow through by a cooling fluid, comprising:
         at least one liquid plate heat exchanger, the at least one liquid plate heat exchanger mounted to the at least one heat generating component;
         a liquid row heat sink, the liquid row heat sink attached to the base plate between the distal base plate end and the at least one electronics module;
         an inlet chassis manifold, the inlet chassis manifold fixed to the first side plate; and an outlet chassis manifold, the outlet chassis manifold fixed to the second side plate; and,
wherein the at least one liquid plate heat exchanger thermally couples to the at least one heat generating component and the at least one liquid plate heat exchanger is in fluid communication with the inlet chassis manifold and outlet chassis manifold, respectively, whereby the at least one liquid plate heat exchanger transports heat away from the at least one heat generating component, and
wherein the liquid row heat sink is in fluid communication with the inlet chassis manifold and outlet chassis manifold, respectfully, and the liquid row heat sink is configured to lower a flowthrough temperature of ambient airflow flowing through the liquid row heat sink.

2. The liquid cooled server chassis of claim 1, wherein the inlet chassis manifold comprises an inlet channel, an inlet channel opening, at least one inlet interior plate conduit opening, and a pair of inlet interior row openings, the inlet channel opening disposed on a front end of the inlet chassis manifold, the pair of inlet interior row openings disposed between the at least one inlet interior plate conduit opening and a distal end of the inlet chassis manifold, the at least one inlet interior plate conduit opening disposed between the pair of inlet interior row openings and the inlet channel opening, and the outlet chassis manifold comprises an outlet channel, an outlet channel opening, at least one outlet interior plate conduit opening, and a pair of outlet interior row openings, the outlet channel opening disposed on a front end of the outlet chassis manifold, the pair of outlet interior row openings disposed between the at least one outlet interior plate conduit opening and a distal end of the outlet chassis manifold, the at least one outlet interior plate conduit opening disposed between the pair of outlet interior row openings and the outlet channel opening, whereby the inlet channel opening is in fluid communication with the at least one inlet interior plate conduit opening and the pair of inlet interior row openings, respectively, and the outlet channel opening is in fluid communication with the at least one outlet interior plate conduit opening and the pair of outlet interior row openings, respectively, and the inlet channel opening and the outlet channel opening are disposed adjacent to the front base plate, respectively.

3. The liquid cooled server chassis of claim 2, wherein the at least one liquid plate heat exchanger is in fluid communication with the inlet chassis manifold and outlet chassis manifold via the at least one inlet interior plate conduit opening and the at least one outlet interior plate conduit opening, respectively, and the liquid row heat sink is in fluid communication with the inlet chassis manifold and outlet chassis manifold via the pair of inlet interior row openings and the pair of outlet interior row openings, respectively.

4. The liquid cooled server chassis of claim 3, wherein the liquid row heat sink is configured to lower a flowthrough temperature of ambient airflow flowing through the liquid row heat sink via the cooling fluid flowing through the liquid row heat sink to the outlet chassis manifold and through the outlet channel opening, and the at least one liquid plate heat exchanger transports heat away from the at least one heat generating component via the cooling fluid flowing through the at least one liquid plate heat exchanger to the outlet chassis manifold and through the outlet channel opening.

5. The liquid cooled server chassis of claim 2, wherein the at least one electronics module comprises a first electronics module having a first heat generating component mounted thereon and a second electronics module having a second heat generating component mounted thereon, the first electronics module and second electronics module mounted to the base plate, respectively, the at least one liquid plate heat exchanger comprises a first liquid plate heat exchanger and a second liquid plate heat exchanger, the first liquid plate heat exchanger and the second liquid plate heat exchanger mounted to the first heat generating component and second heat generating component, respectively, the at least one inlet interior plate conduit opening comprises a first inlet interior plate conduit opening and a second inlet interior plate conduit opening, the first inlet interior plate conduit opening disposed between the pair of inlet interior row openings and the inlet channel opening, the second inlet interior plate conduit opening disposed between the first inlet interior plate conduit opening and the inlet channel opening, and the at least one outlet interior plate conduit opening comprises a first outlet interior plate conduit opening and a second outlet interior plate conduit opening, the first outlet interior plate conduit opening disposed between the pair of outlet interior row openings and the outlet channel opening, the second outlet interior plate conduit opening disposed between the first outlet interior plate conduit opening and the outlet channel opening, wherein the first liquid plate heat exchanger thermally couples to the first heat generating component and the second liquid plate heat exchanger thermally couples to the second heat generating component, and the first liquid plate heat exchanger and the second liquid plate heat exchanger are in fluid communication with the inlet chassis manifold and outlet chassis manifold, respectively, via the first inlet interior plate conduit opening and second inlet interior plate conduit opening and first outlet interior plate conduit opening and second outlet interior plate conduit opening, respectively, and the liquid row heat sink is in fluid communication with the inlet chassis manifold and outlet chassis manifold via the pair of inlet interior row openings and the pair of outlet interior row openings, respectively, whereby the first liquid plate heat exchanger and the second liquid plate heat exchanger transport heat away from the first heat generating component and second heat generating component, respectively.

6. The liquid cooled server chassis of claim 5, wherein the liquid row heat sink is configured to lower a flowthrough temperature of ambient airflow flowing through the liquid row heat sink via the cooling fluid flowing through the liquid row heat sink to the outlet chassis manifold and through the outlet channel opening, and the first liquid plate heat exchanger and the second liquid plate heat exchanger transport heat away from the first heat generating component and second heat generating component, respectively, via the cooling fluid flowing through the first liquid plate heat exchanger and the second liquid plate heat exchanger, respectively, to the outlet chassis manifold and through the outlet channel opening.

7. The liquid cooled server chassis of claim 5, wherein the first electronics module is attached to the base plate between the liquid row heat sink and front base plate end and the second electronics module is attached to the base plate between the first electronics module and front base plate end.

8. The liquid cooled server chassis of claim 7, wherein the second electronics module, first electronics module, and liquid row heat sink are parallel arranged, such that a cooling power of the cooling fluid flowing through the second electronics module, first electronics module, and liquid row heat sink, from the inlet chassis manifold, respectively, is evenly distributed to the second electronics module, first electronics module, and liquid row heat sink, respectively.

9. The liquid cooled server chassis of claim 1, wherein the liquid row heat sink further comprises at least a pair of airflow optimizers disposed on opposing sides of the liquid row heat sink, the pair of airflow optimizers facing the front base plate end and the distal base plate end, respectively, whereby the liquid row heat sink lowers the flowthrough temperature of ambient airflow flowing through the liquid row heat sink when a fluid temperature of the cooling fluid flowing through the liquid row heat sink is configured such that a surrounding temperature of ambient air surrounding the liquid row heat sink is lower than a flowthrough temperature of ambient airflow flowing through the liquid row heat sink, and a resulting temperature of ambient airflow leaving the liquid row heat sink is lowered, and whereby the pair of airflow optimizers optimize airflow flowing from the distal base plate end, passing through the at least one electronics module, and passing through the front base plate end.

10. The liquid cooled server chassis of claim 1, wherein the inlet chassis manifold is integrally formed with the first side plate and the outlet chassis manifold is integrally formed with the second side plate.

11. The liquid cooled server chassis of claim 1, wherein a shape of the liquid cooled server chassis comprises a cuboid shape having a base and at least two opposing lateral sides, whereby the base comprises the base plate and the at least two opposing lateral sides comprise the first side plate and the second side plate, respectively.

12. The liquid cooled server chassis of claim 1, wherein the inlet chassis manifold comprises an external inlet manifold lateral side and a first inlet manifold lateral side, opposite the external inlet manifold lateral side, the first inlet manifold lateral side fixed to the first side plate, and wherein the outlet chassis manifold comprises an external outlet manifold lateral side and a second outlet manifold lateral side, opposite the external outlet manifold lateral side, the second outlet manifold lateral side fixed to the second side plate, and wherein an exterior shape of the inlet chassis manifold and the outlet chassis manifold comprises a cuboid shape, respectively, and wherein the external inlet manifold lateral side and external outlet manifold lateral side are configured for rail mounts to be fixed thereto, respectively.

13. The liquid cooled server chassis of claim 1, wherein the at least one heat generating component mounted to the at least one electronics module comprises a processor.

14. The liquid cooled server chassis of claim 13, wherein the processor comprises a central processing unit (CPU).

15. The liquid cooled server chassis of claim 1, wherein the at least one liquid plate heat exchanger is a liquid cold plate.

16. The liquid cooled server chassis of claim 1, wherein the liquid row heat sink is a water-cooled heat sink row.

17. The liquid cooled server chassis of claim 1, wherein the at least one liquid plate heat exchanger is in fluid communication with the inlet chassis manifold and outlet chassis manifold, respectively, via a tubing, respectively, whereby each of the tubing comprises no more than one bend from the at least one liquid plate heat exchanger to the inlet chassis manifold and outlet chassis manifold, respectively, and wherein the liquid row heat sink is in fluid communication with the inlet chassis manifold and outlet chassis manifold, respectfully, via a barbed fitting, respectively.

18. The liquid cooled server chassis of claim 17, wherein the first side plate and second side plate each comprise a plurality of cut-outs, each of the plurality of cut-outs configured such that the tubing fluidly communicating the at least one liquid plate heat exchanger with the inlet chassis manifold and outlet chassis manifold, respectively, comprise no more than one bend from the at least one liquid plate heat exchanger to the inlet chassis manifold and outlet chassis manifold, respectively, and configured such that the barbed fitting fluidly communicates the liquid row heat sink with the inlet chassis manifold and outlet chassis manifold, respectfully, directly.

19. The liquid cooled server chassis of claim 1, wherein an amount of the at least one electronics module having at least one heat generating component mounted thereon and an amount of the at least one liquid plate heat exchanger mounted to the at least one heat generating component is greater than two.

20. The liquid cooled server chassis of claim 1, wherein an amount of the a liquid row heat sink attached to the base plate is greater than one.

* * * * *